(12) United States Patent
Laidig et al.

(10) Patent No.: US 12,117,732 B2
(45) Date of Patent: Oct. 15, 2024

(54) IMAGE STABILIZATION FOR DIGITAL LITHOGRAPHY

(71) Applicant: Applied Materials, Inc., Santa Clara, CA (US)

(72) Inventors: Thomas L. Laidig, Richmond, CA (US); Christopher Dennis Bencher, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 67 days.

(21) Appl. No.: 17/915,056

(22) PCT Filed: Apr. 29, 2020

(86) PCT No.: PCT/US2020/030465
§ 371 (c)(1),
(2) Date: Sep. 27, 2022

(87) PCT Pub. No.: WO2021/221633
PCT Pub. Date: Nov. 4, 2021

(65) Prior Publication Data
US 2023/0152712 A1     May 18, 2023

(51) Int. Cl.
*G03F 7/20* (2006.01)
*G03F 7/00* (2006.01)

(52) U.S. Cl.
CPC ...... *G03F 7/70508* (2013.01); *G03F 7/70291* (2013.01); *G03F 7/709* (2013.01)

(58) Field of Classification Search
CPC .. G03F 7/70508; G03F 7/70291; G03F 7/709; G03F 7/2051
See application file for complete search history.

(56) References Cited

U.S. PATENT DOCUMENTS

| | | | | |
|---|---|---|---|---|
| 5,668,588 A | * | 9/1997 | Morizumi | ............ H04N 1/0432 347/240 |
| 2004/0113101 A1 | | 6/2004 | Li et al. | |
| 2005/0225788 A1 | | 10/2005 | Katayama et al. | |

(Continued)

FOREIGN PATENT DOCUMENTS

| | | |
|---|---|---|
| JP | 2005258352 A | 9/2005 |
| JP | 2007052080 A | 3/2007 |

(Continued)

OTHER PUBLICATIONS

PCT/US2020/030465, International Search Report and Written Opinion dated Jan. 27, 2021, 9 pages.

(Continued)

*Primary Examiner* — Mesfin T Asfaw
(74) *Attorney, Agent, or Firm* — Patterson + Sheridan, LLP

(57) ABSTRACT

The present disclosure provides methods and systems for correcting the shooting of images from a spatial light modulator (SLM) to a substrate, when cross-scan vibrations, including sub-pixel cross-scan vibrations, are present. The methods and systems include shifting a mask pattern on an SLM rotated relative to the in-scan direction of travel on a substrate, shifting along an axis of the SLM to correct for cross-scan vibrations, and either delaying, or accelerating, the shooting of the mask pattern onto the substrate.

15 Claims, 12 Drawing Sheets

(56) References Cited

U.S. PATENT DOCUMENTS

| | | | |
|---|---|---|---|
| 2006/0033902 A1* | 2/2006 | Latypov | G03F 7/70291 |
| | | | 355/67 |
| 2008/0180648 A1 | 7/2008 | Mei | |
| 2013/0070223 A1 | 3/2013 | Peijster et al. | |
| 2017/0090303 A1 | 3/2017 | Johnston et al. | |

FOREIGN PATENT DOCUMENTS

| | | | |
|---|---|---|---|
| JP | 2007273717 A | 10/2007 |
| JP | 2009044060 A | 2/2009 |
| JP | 2011009396 A | 1/2011 |

OTHER PUBLICATIONS

Japanese Patent Application No. 2022-565614, Office Action dated Jan. 9, 2024, 4 pages.

* cited by examiner

IMAGE STABILIZATION FOR DIGITAL LITHOGRAPHY

CROSS-REFERENCE TO RELATED APPLICATIONS

This application is a 371 U.S. National Stage of International Application No. PCT/US2020/030465, filed Apr. 29, 2020, which is herein incorporated by reference.

BACKGROUND

Field

Embodiments of the present disclosure generally relate to photolithography systems. More particularly, embodiments of the present disclosure relate to a method of image stabilization for digital lithography.

Description of the Related Art

Digital lithography is widely used in the manufacturing of semiconductor devices, such as for back-end processing of semiconductor devices, and display devices, such as liquid crystal displays (LCDs) and light emitting diode (LED) displays. For example, large area substrates are often utilized in the manufacture of LCDs. LCDs, or flat panel displays, are commonly used for active matrix displays, such as computers, touch panel devices, personal digital assistants (PDAs), cell phones, television monitors, and the like. Generally, flat panel displays include a layer of liquid crystal material as a phase change material at each pixel, sandwiched between two plates. When power from a power supply is applied across or through the liquid crystal material, an amount of light passing through the liquid crystal material is controlled, i.e., selectively modulated, at the pixel locations enabling images to be generated on the display.

A conventional digital lithography system utilizes may utilize one or more image projection systems. Each image projection system is configured to project one or more write beams into a photoresist layer on a surface of the substrate. Each image projection system projects one or more write beams to the surface of the substrate. A pattern, also known as a mask pattern, is written into the photoresist layer on the surface of the substrate by a write beam projected by the projection lens system. However, due to vibrations in the digital lithography system, write beams write corresponding images result in a rough, and sometimes in wavy, or saw-toothed pattern. In some cases, the roughness can have a pitch of up to 10 nm to 10 um. Sources of vibration may, for example, be found in actuators present in the digital lithography system and air-handling systems, varying stage velocities during the imaging process, air bearing flutter, and periodic resonances in stage and eye mounting assemblies.

Accordingly, what is needed in the art is a method stabilizing images to reduce line roughness.

SUMMARY

Methods disclosed herein generally relate to method for image stabilization for digital lithography. The method includes providing a spatial light modulator (SLM) in an image projection system, positioned at a rotation angle relative to an in-scan direction, comprising a plurality of SLM pixels, and rasterizing a mask pattern for projection from the SLM, the mask pattern corresponding to a first set of SLM pixels of the plurality of pixels. Further embodiments include detecting at a controller, a cross-scan vibration between the SLM and a substrate, the cross-scan vibration causing a cross-scan deviation, and shifting the mask pattern within the SLM in the in-scan direction to a second set of SLM pixels, in response to the detecting, to correct for the cross-scan deviation.

Further embodiments disclosed herein generally relate to a system for digital lithography comprising a processor and a memory, the memory comprising computer readable instructions for image stabilization. The method includes providing a spatial light modulator (SLM) in an image projection system, positioned at a rotation angle relative to an in-scan direction, comprising a plurality of SLM pixels, and rasterizing a mask pattern for projection from the SLM, the mask pattern corresponding to a first set of SLM pixels of the plurality of pixels. Further embodiments include detecting at a controller, a cross-scan vibration between the SLM and a substrate, the cross-scan vibration causing a cross-scan deviation, and shifting the mask pattern within the SLM in the in-scan direction to a second set of SLM pixels, in response to the detecting, to correct for the cross-scan deviation.

Embodiments disclosed herein generally relate to non-transitory computer-readable medium comprising computer readable instructions for a method for image stabilization for digital lithography. Embodiments of the method includes providing a spatial light modulator (SLM) in an image projection system, positioned at a rotation angle relative to an in-scan direction, comprising a plurality of SLM pixels, and rasterizing a mask pattern for projection from the SLM, the mask pattern corresponding to a first set of SLM pixels of the plurality of pixels. Further embodiments include detecting at a controller, a cross-scan vibration between the SLM and a substrate, the cross-scan vibration causing a cross-scan deviation, and shifting the mask pattern within the SLM in the in-scan direction to a second set of SLM pixels, in response to the detecting, to correct for the cross-scan deviation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
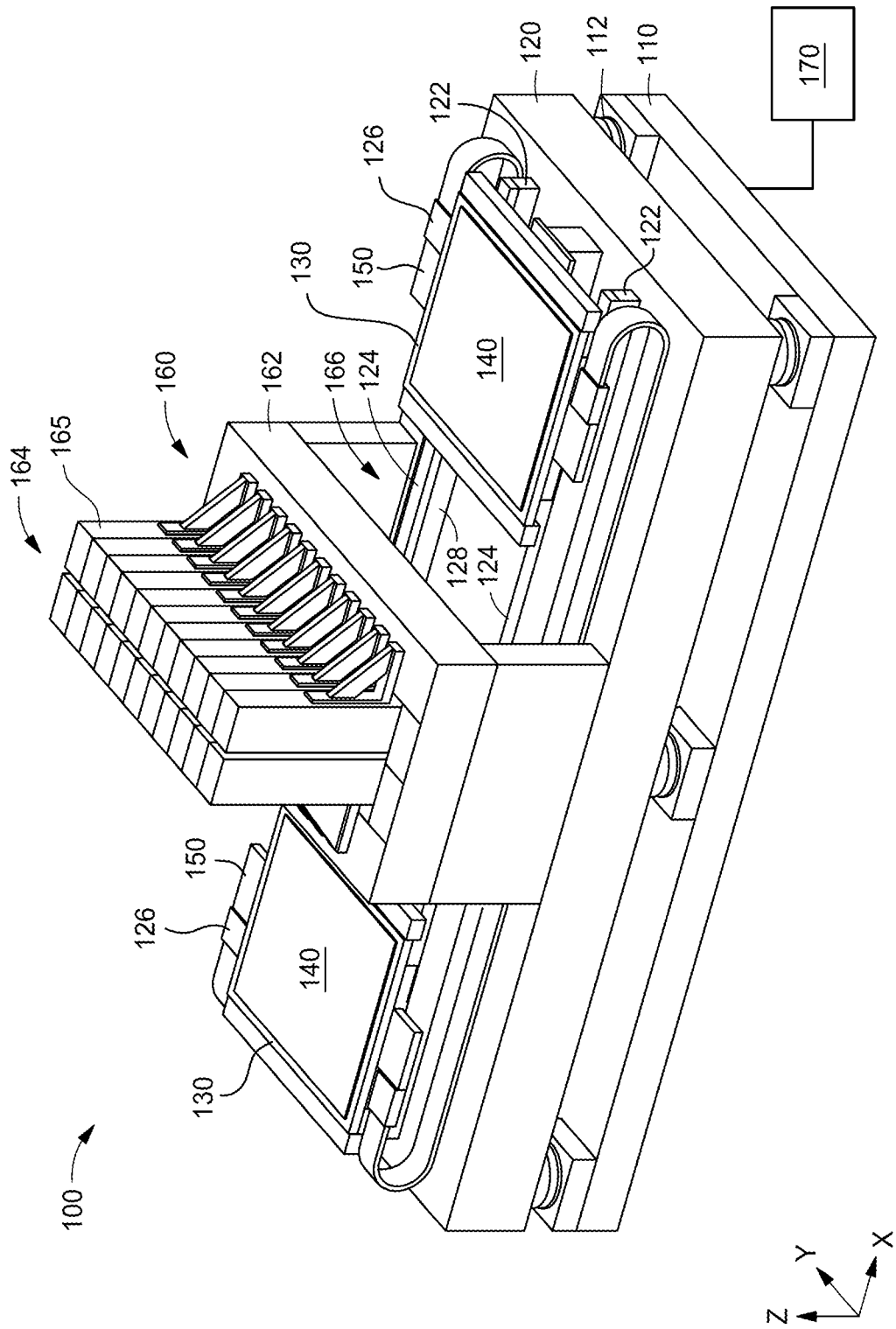
FIG. 1 is a perspective view of a digital lithography system, according to disclosed embodiments.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure provides a method for correcting the shooting of images from a spatial light modulator (SLM) to a substrate, when cross-scan vibrations, including sub-pixel cross-scan vibrations, are present.

In a typical digital lithography system, if in-scan vibration is detected, an image may be shot earlier or later to compensate for the vibration. However, if cross-scan vibration is detected, an image is rasterized in real time and provided to the SLM and shot to the substrate, a computationally expensive process. Moreover, if the cross-scan vibration is less than a pixel of the SLM, prior approaches do not have a method of correcting for this deviation.

The SLM is provided in an image projection system at an angle relative to an in-scan direction, approximately 1° in some embodiments that may correct for increments of up to $1/100^{th}$ of a pixel, up to 26° that could correct for increments up to ½ of a pixel. The inventors have discovered that due to this angle, a movement of the SLM in the in-scan direction by a pixel, results in a 1.5~2% pixel shift in the corresponding cross-scan direction which can be used to correct for cross-scan vibration. The amount of pixel shift can be determined by dividing the cross-scan deviation by the tangent of the rotation angle of the SLM. For example, $\tan(1°)=0.017$ enables cross scan vibration corrections in increments<$1/50$th of a pixel; similarly 3° enables corrections in increments<$1/20$th of a pixel, 5° enables corrections in increments<$1/10$th of a pixel, 11° enables corrections in increments<$1/5$th of a pixel, 14° enables corrections in increments<$1/4$th of a pixel, 18° enables corrections in increments<$1/3$th of a pixel and 26° enables corrections in increments<$1/2$th of a pixel. By shifting a rasterized image along an X-axis of the rotated SLM, cross-scan vibration by sub-pixel distances can be compensated for. Once shifted, the deviation of the image is offset from the intended target in an in-scan direction only, requiring adjustment of timing of the shot as mentioned above. In some embodiments, a shot may be timed by setting an in-scan direction coordinate of the substrate, and triggering the shot when the SLM reaches that coordinate. In this context, "adjustment of the timing of the shot," in some embodiments, means changing the in-scan coordinate at which the shot is triggered. By taking advantage of the relative rotated position of the SLM relative to the in-scan direction, each image may be rasterized before the SLM reaches a given image destination. Moreover, the image provided will substantially be in accordance with the customer design, as opposed to requiring re-rasterization in real time to compensate for cross-scan vibration. This approach not only decreases the processing burden on processor and memory resources, but produces a more faithful rendering of the intended customer design, with less line edge roughness.

FIG. 1 is a perspective view of a system 100 that may benefit from embodiments disclosed herein. The system 100 includes a base frame 110, a slab 120, a stage 130, and a processing apparatus 160. The base frame 110 may rest on the floor of a fabrication facility and may support the slab 120. Passive air isolators 112 may be positioned between the base frame 110 and the slab 120. The slab 120 may be a monolithic piece of granite, and the stage 130 may be disposed on the slab 120. A substrate 140 may be supported by the stage 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto the stage 130.

The substrate 140 may, for example, be made of quartz and be used as part of a flat panel display. In other embodiments, the substrate 140 may be made of other materials. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of supports 122 may be disposed on the slab 120, and the slab 120 and the pair of supports 122 may be a single piece of material. The pair of tracks 124 may be supported by the pair of supports 122, and the stage 130 may move along the tracks 124 in the in-scan direction. In one embodiment, the pair of tracks 124 is a pair of parallel magnetic channels. As shown, each track 124 of the pair of tracks 124 is linear. In other embodiments, the track 124 may have a non-linear shape. An encoder 126 or other sensor may be coupled to the stage 130 in order to provide location information to a controller 170, and may detect movement in a stage due to vibration. In some embodiments, encoder 126 may be an interferometer, or other device or sensor capable of detecting the location of a stage, vibration of a stage, and in-scan and/or cross-scan deviation of a stage due to vibration.

The processing apparatus 160 may include a support 162 and a processing unit 164. The support 162 may be disposed on the slab 120 and may include an opening 166 for the stage 130 to pass under the processing unit 164. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems 301 (shown in FIG. 3) disposed in a case 165. The processing apparatus 160 may be utilized to perform maskless direct patterning. During operation, one of the stage 130 moves in the in-scan direction from a loading position, as shown in FIG. 1, to a processing position. The processing position may refer to one or more positions of the stage 130 as the stage 130 passes under the processing unit 164. During operation, the stage 130 may be lifted by a plurality of air bearings 202 (shown in FIG. 2) and may move along the pair of tracks 124 from the loading position to the processing position. A plurality of vertical guide air bearings 202 (shown in FIG. 2) may be coupled to the stage 130 and positioned adjacent an inner wall 128 of each support 122 in order to stabilize the movement of the stage 130. The stage 130 may also move in the cross-scan direction by moving along a track 150 for processing and/or indexing the substrate 140.

Figure 2:
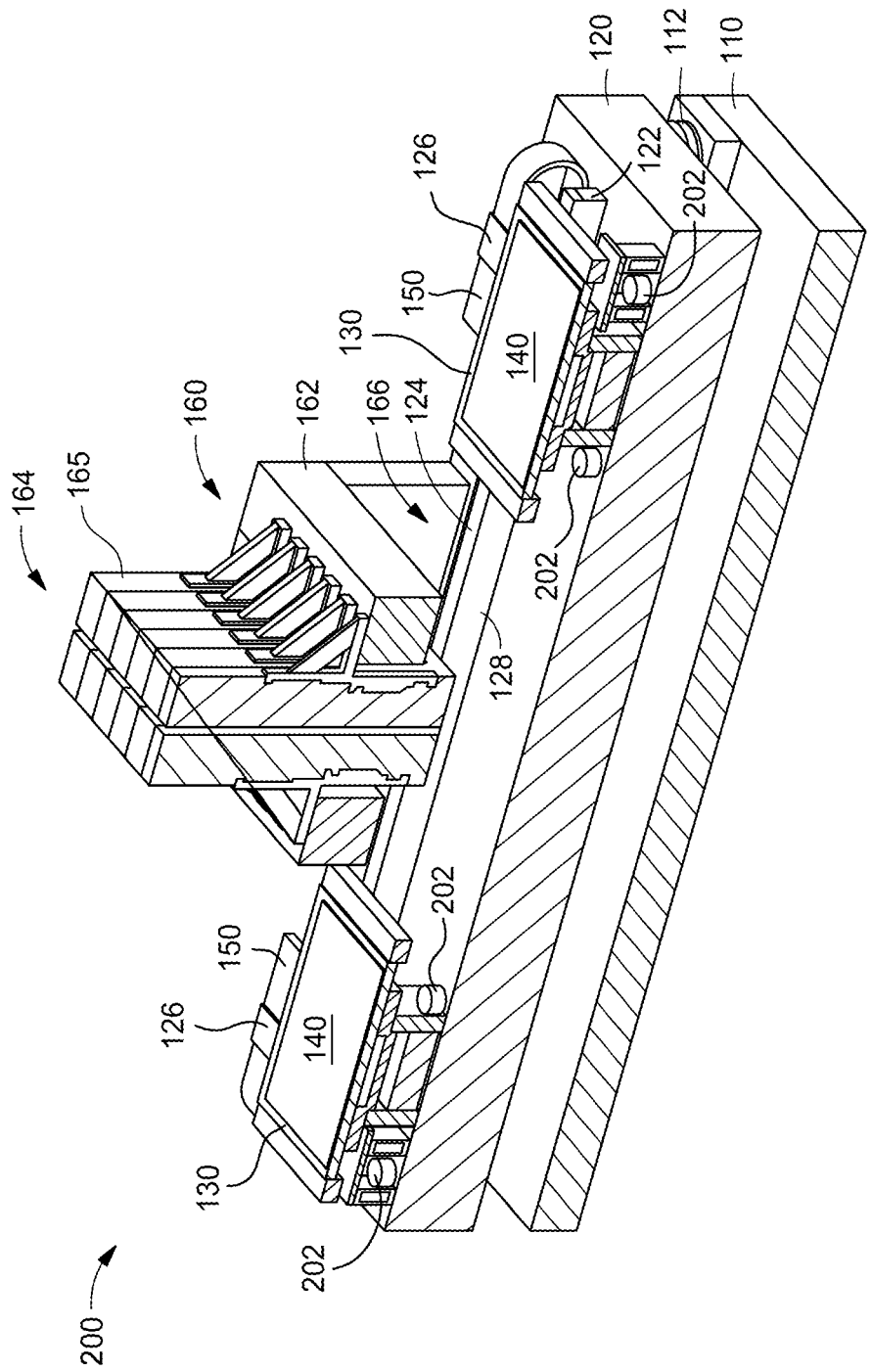
FIG. 2 is a schematic, cross-sectional view of an image projection system according to embodiments disclosed herein.

FIG. 2 is a cross-sectional side view of the system 100 of FIG. 1 according to one embodiment. As shown, the stage 130 includes a plurality of air bearings 202 for lifting the stage 130. Stage 130 may also include a motor coil (not shown) for moving the stage 130 along the tracks 124. The stage 130 and the processing apparatus 160 may be enclosed by an enclosure (not shown) in order to provide temperature and pressure control.

The system 100 also includes a controller 170. The controller is generally designed to facilitate the control and automation of the processing techniques described herein. The controller may be coupled to or in communication with one or more of the processing apparatus 160, the stage 130, and the encoder 126. The processing apparatus 160 and the stage 130 may provide information to the controller regarding the substrate processing and the substrate aligning. For example, the processing apparatus 160 may provide information to the controller to alert the controller that substrate processing has been completed. The encoder 126 may provide location information to the controller, and the location information is then used to control the stage 130 and the processing apparatus 160.

The controller may include a central processing unit (CPU) (not shown), memory (not shown), and support circuits (or I/O) (not shown). The CPU may be one of any form of computer processors that are used in industrial settings for controlling various processes and hardware (e.g., pattern generators, motors, and other hardware) and monitor the processes (e.g., processing time and substrate position). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position.

Figure 3:
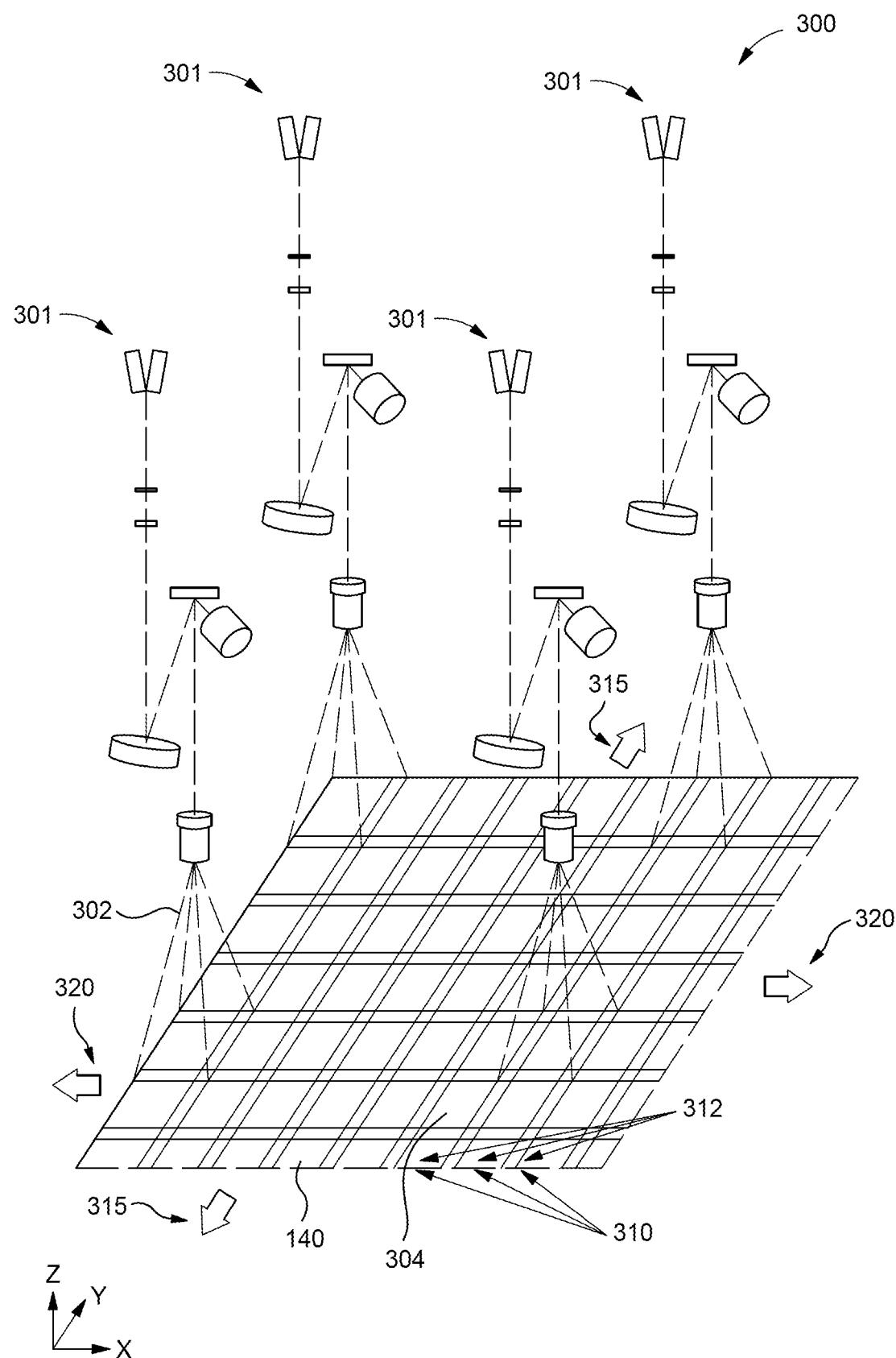
FIG. 3 depicts a perspective schematic view of a plurality of image projection systems according to disclosed embodiments.

FIG. 3 is a perspective schematic view of a plurality of image projection systems 301 according to one embodiment. As shown in FIG. 3, each image projection system 301 produces a plurality of write beams 302 onto a surface 304 of the substrate 140, corresponding to a plurality of processing positions 312, along a plurality of tracks 310, each of the tracks 310 to be scanned by one or more of the write beams 302. The movement of the substrate 140 is in an in-scan direction indicated by arrow 315, while the cross-scan direction is indicated by arrow 320. As the substrate 140 moves in the in-scan direction and cross-scan direction, the entire surface 304 may be patterned by the write beams 302. The number of the image projection systems 301 may vary based on the size of the substrate 140 and/or the speed of stage 130. In one embodiment, there are 22 image projection systems 301 in the processing apparatus 160.

Figure 4:
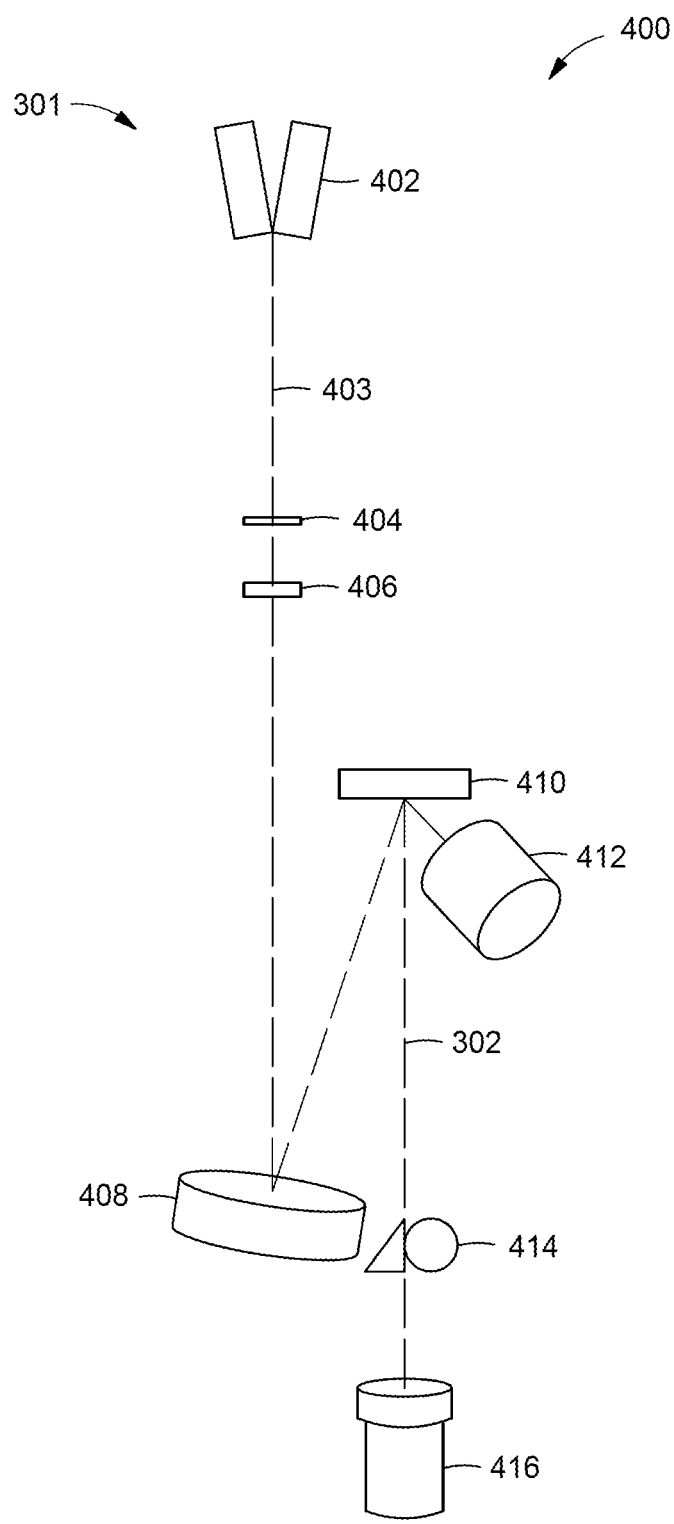
FIG. 4 depicts a perspective schematic view of an image projection system according to disclosed embodiments.

FIG. 4 is a perspective schematic view of one image projection system 301 of the plurality of image projection systems 301 of FIG. 3 according to one embodiment.

The image projection system 301 includes a spatial light modulator (SLM) 410 and projection optics 416. The components of the image projection system 310 vary depending on the SLM 410 being used. The SLM 410 includes, but is not limited to, an array of microLED's, VCSEL's, liquid crystal displays (LCDs), or any solid state emitter of electromagnetic radiation, and a digital mirror device (DMD). The SLM 410 includes a plurality of spatial light modulator pixels. Each SLM pixel of the plurality of SLM pixels are individually controllable and are configured to project a write beam corresponding to a pixel of the plurality of pixels (e.g., shown in FIGS. 5, 6, 7, and others). The compilation of plurality of pixels form the pattern written into the photoresist, referred to herein as the mask pattern. The projection optics 416 includes projection lenses, for example, 10× objective lenses, used to project the light onto the substrate 140. In operation, based on the mask pattern data provided to the SLM 410 by the controller 170, each SLM pixel of the plurality of SLM pixels is at an "on" position or "off" position. Each SLM pixel at an "on" position forms a write beam that the projection optics 416 then projects the write beam to the photoresist layer surface of the substrate 140 to form a pixel of the mask pattern.

In one embodiment, spatial light modulator 410 is a DMD. The image projection system 301 includes a light source 402, an aperture 404, a lens 406, a frustrated prism assembly 408, the SLM 410, and the projection optics 416. In this embodiment, the SLM 410 includes a plurality of mirrors, i.e, the plurality of spatial light modulator pixels. Each mirror of the plurality of mirrors corresponds to a pixel that may correspond to a pixel of the mask pattern. In some embodiments, the DMD includes more than about 4,000,000 mirrors, while in other embodiments may include 1920× 1080 mirrors, which represent the number of pixels of a high definition television. The light source 402 is any suitable light source, such as a light emitting diode (LED) or a laser, capable of producing a light having a predetermined wavelength. In one embodiment, the predetermined wavelength is in the blue or near ultraviolet (UV) range, such as less than about 450 nm. The frustrated prism assembly 408 includes a plurality of reflective surfaces. In operation, a light beam 403 having is produced by the light source 402. The light beam 403 is reflected to the DMD by the frustrated prism assembly 408. When the light beam 403 reaches the mirrors of the DMD, each mirror at "on" position reflect the light beam 403, i.e., forms a write beam, also known as a "shot", that the projection optics 416 then projects to shot the photoresist layer surface of the substrate 140. The plurality of write beams 302, also known as a plurality of shots, forms a plurality of pixels of the mask pattern.

Figure 5:
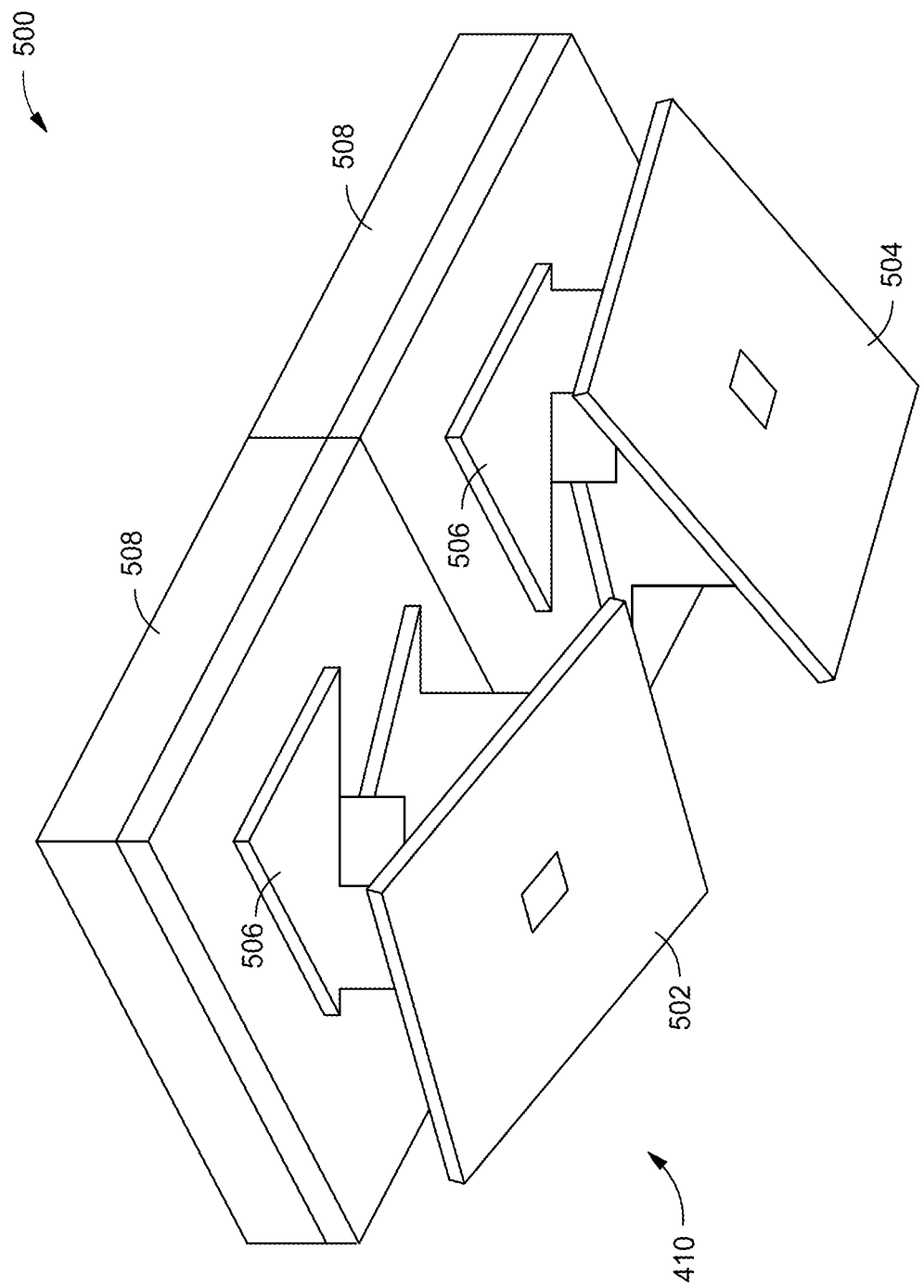
FIG. 5 depicts is an enlarged perspective view of two pixel elements a spatial light modulator, according to disclosed embodiments.

FIG. 5 is an enlarged perspective view of two pixel elements 502, 504 of the SLM 410 according to one embodiment. In the embodiment in which the SLM 410 is a DMD, the pixel elements may be mirrors. As shown, each pixel element 502, 504 is disposed on a tilting mechanism 506, which is disposed on a memory cell 508. The memory cell 508 may be a CMOS SRAM. During operation, each pixel element 502, 504 is controlled by loading the mask data into the memory cell 508. The mask data electrostatically controls the tilting of the pixel element 502, 504 in a binary fashion. When the pixel element 502, 504 is in reset mode or no power is applied, the pixel element 502, 504 is in a flat position not corresponding to any binary position. Zero (0) in binary may correspond to "off" position, which means the pixel element is tilted at −10 degrees, −12 degrees, or any other feasible tilt in the negative direction. One (1) in binary may correspond to "on" position, which means the pixel element is tilted at +10 degrees, +12 degrees, or any other feasible tilt in the positive direction. As shown in FIG. 5, the pixel element 502 is at "off" position and the pixel element 504 is at "on" position.

Figure 6:
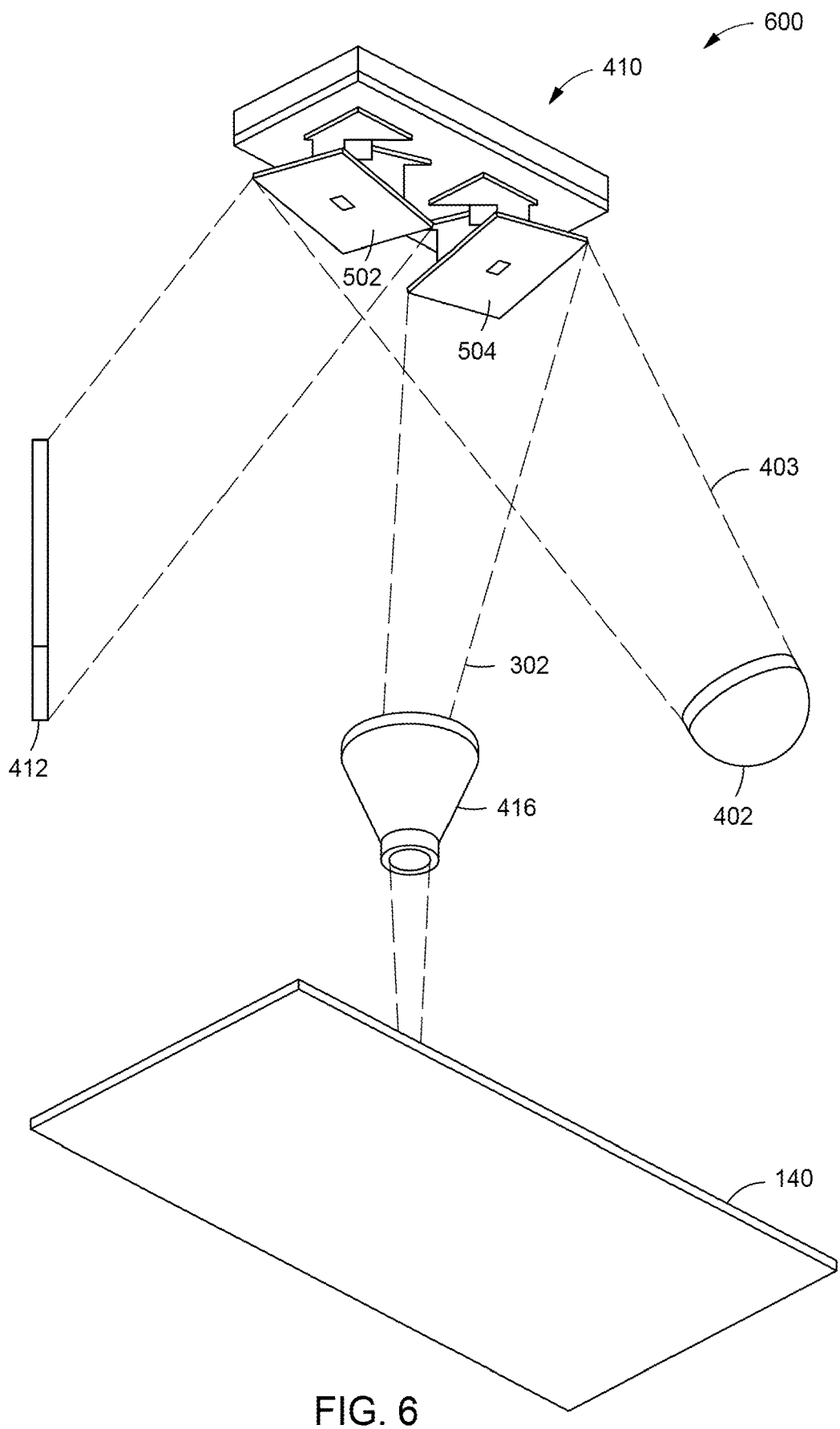
FIG. 6 schematically illustrates a beam being reflected by the two pixel elements of a spatial light modulator, according to disclosed embodiments.

FIG. 6 schematically illustrates the beam 403 being reflected by the two pixel elements 502, 504 of the SLM 410 of FIG. 5 according to one embodiment. As shown, the pixel element 502, which is at "off" position, reflects the beam 403 generated from the light source 402 to the light dump 412. The pixel element 504, which is at "on" position, forms the write beam 302 by reflecting the beam 403 to the projection lens 416, which in turn projects the beam 403 to the substrate 140.

Figure 7:
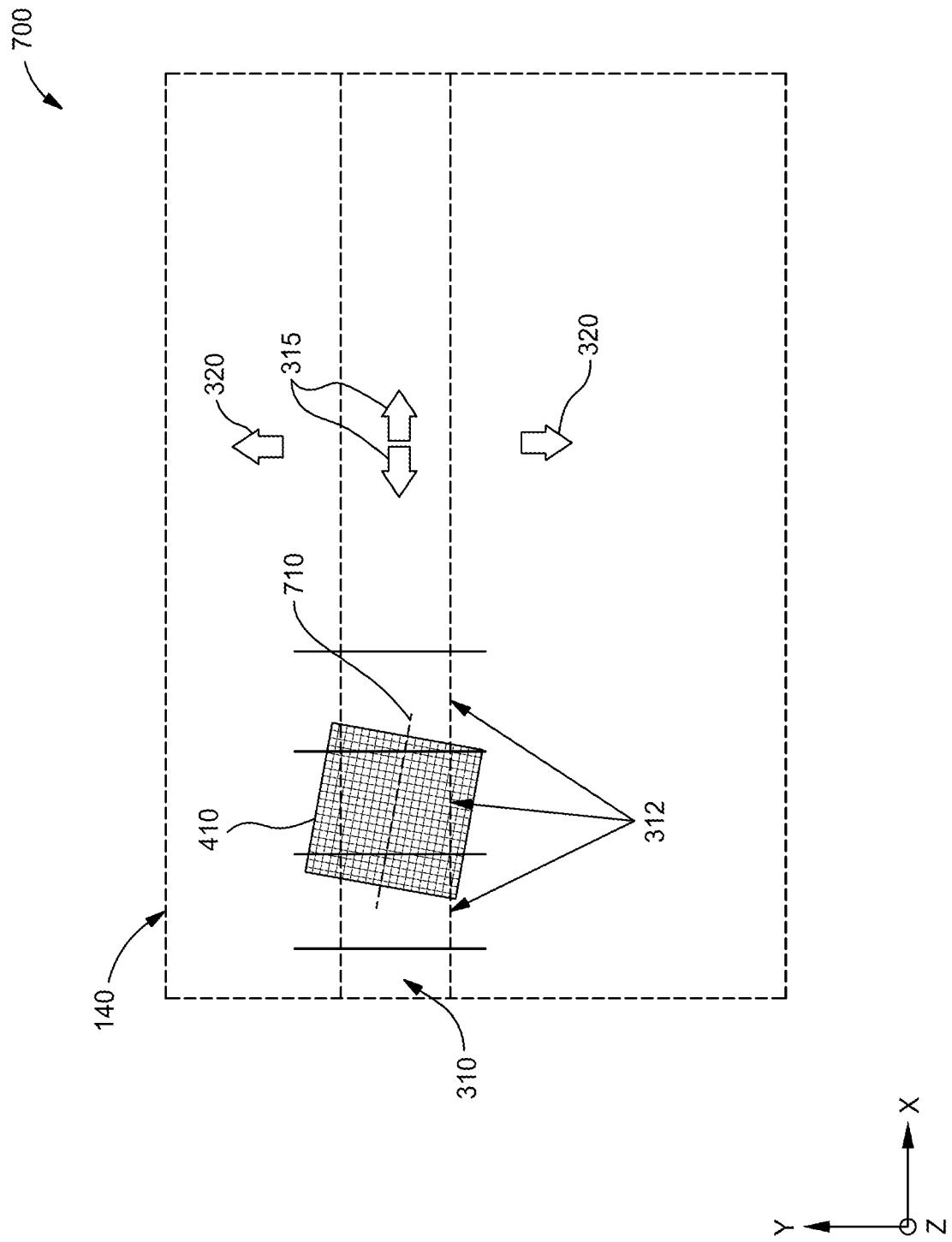
FIG. 7 schematically illustrates an embodiment of a spatial light modulator as a stage passes under a processing unit, according to disclosed embodiments.

FIG. 7 schematically illustrates one embodiment of a SLM 410 as the stage 130 passes under the processing unit 164, conveying the substrate 140 underneath the image projection systems 301 in the in-scan direction indicated by arrow 315, with the SLM 410 traveling along track 310, to shoot a mask pattern at a plurality of processing positions 312. At each processing position 312, the pixel elements of the SLM 410 direct light toward individual pixels of the substrate 140 or away into the light dump 412.

The pixel elements 502, 504, etc., of the SLM 410 are arranged in an array. As shown in FIG. 7, the SLM 410 is positioned substantially aligned with the substrate 140 but not perfectly aligned. The rotational offset of the SLM 410 with the substrate 140 limits errors. In some embodiments, the rotational offset of the SLM 410 (e.g., the rotational offset of an SLM axis 710 relative to the in-scan direction of the SLM 410, indicated by arrow 315, is approximately 1 degree (e.g., for correction increments of <1/50th of a pixel), while in other embodiments may be in a range of 0.5 degrees to 26 degrees for correction increments ranging from $1/100^{th}$ of a pixel to 0.5 pixels. The rotation of the SLM 410 may be seen in the positioning of an SLM axis 710. In embodiments, SLM axis 710 is be offset from the in-scan direction of the substrate by the same rotational angle at which the SLM 410 is offset from the in-scan direction, and may be considered to be the in-scan axis of the SLM.

As the substrate 140 moves under the SLM 410, if more than a threshold area of each pixel of the substrate 140 is positioned under the SLM 410, the pixel element 502, 504, etc. corresponding to the pixel in that location will receive an "on" (or "off" signal depending on the image tone (e.g., photoresist type)). If less than a threshold area of each pixel of the substrate 140 is positioned under the SLM 410, the pixel element 502, 504, etc. corresponding to the pixel in that location will not receive an "off" (or "on" signal depending on the image tone). The threshold area may be 50% of the surface area of the pixel. In other threshold tests, the criteria may be whether or not the pixel centroid is inside or outside the geometry to be printed.

In one embodiment, the array of pixel elements 502, 504, etc., in the SLM 410 may be rectangular, with more pixel elements 502, 504 disposed in a cross-scan direction than in an In-scan direction, where the in-scan direction substantially corresponds to the direction of movement of the stage 130 and hence of the substrate 140. In other embodiments, the SLM 410 may be a square shape, or any other shape.

For example, the ratio of the number of pixel elements 502, 504 disposed in the in-scan direction to the number of pixel elements 502, 504 disposed in the cross-scan direction may be about 9:16 or about 7:21 or about 3:4. In one embodiment, the SXGA+ type of SLM provides 1400 mirror pixels in the Y direction and 1050 mirror pixels in the X direction, for a mirror pixel count of about 1.5 million and an aspect ratio (Y:X) of about 4:3. In another embodiment, the 1080P type of SLM provides 1920 mirror pixels in the Y direction and 1080 mirror pixels in the X direction, for a total mirror pixel count of about 2 million and an aspect ratio (Y:X) of about 16:9. In another embodiment, the WQXGA type of SLM provides 2560 mirror pixels in the Y direction and 1600 mirror pixels in the X direction, for a total mirror pixel count of about 4 million and an aspect ratio (Y:X) of about 16:10. In another embodiment, the 4K type of SLM provides 4096 mirror pixels in the Y direction and 2160 mirror pixels in the X direction, for a total mirror pixel count of about 8 million and an aspect ratio (Y:X) of about 17:9. In another embodiment, a SLM may be created that is similar to the 4K type, but with half the number of SLM pixel elements in the in-scan direction and double the number of pixel elements in the cross-scan direction. This type of SLM, called the Half 4K+Half 4K type of SLM, provides 8192 mirror pixels in the cross-scan direction and 1080 mirror pixels in the in-scan direction, for a total mirror pixel count of about 8 million and an aspect ratio (cross-scan:in-scan) of about 68:9. In another embodiment, a SLM may be created that doubles the number of mirrors in both the in-scan and cross-scan directions. This type of SLM, called the Full 4K+Full 4K type of SLM, provides 8192 mirror pixels in the cross-scan direction and 2160 pixel elements in the in-scan direction, for a total mirror pixel count of about 16 million and an aspect ratio (cross-scan: in-scan) of about 34:9.

Other embodiments may also be commercially practicable and/or available. For example, one embodiment of the SLM may feature pixel elements in the in-scan direction numbering 1080 and pixel elements in the cross-scan direction numbering 1920. In another embodiment, the SLM may feature pixel elements in the in-scan direction numbering 1600 and pixel elements in the cross-scan direction numbering 2560. In another embodiment, the SLM may feature pixel elements in the in-scan direction numbering 1960 and pixel elements in the cross-scan direction numbering 3880. In another embodiment, the SLM may feature an aspect ratio (cross-scan:in-scan) of 21:7.

A person of ordinary skill in the art will understand that other ratios may also be possible. The embodiments share the trait that the larger number of pixel elements is provided in the direction of scan, which increases scanning efficiency. However, the specific ratio may vary as a function of design and manufacturing so long as the number of pixel elements disposed in the cross-scan direction is greater than the number of mirrors disposed in the in-scan direction. It other embodiments, the number of pixel elements in the in-scan direction may be greater than in the cross-scan direction, while in yet further embodiments, the number of pixel elements in each direction may be the same.

Figure 8:
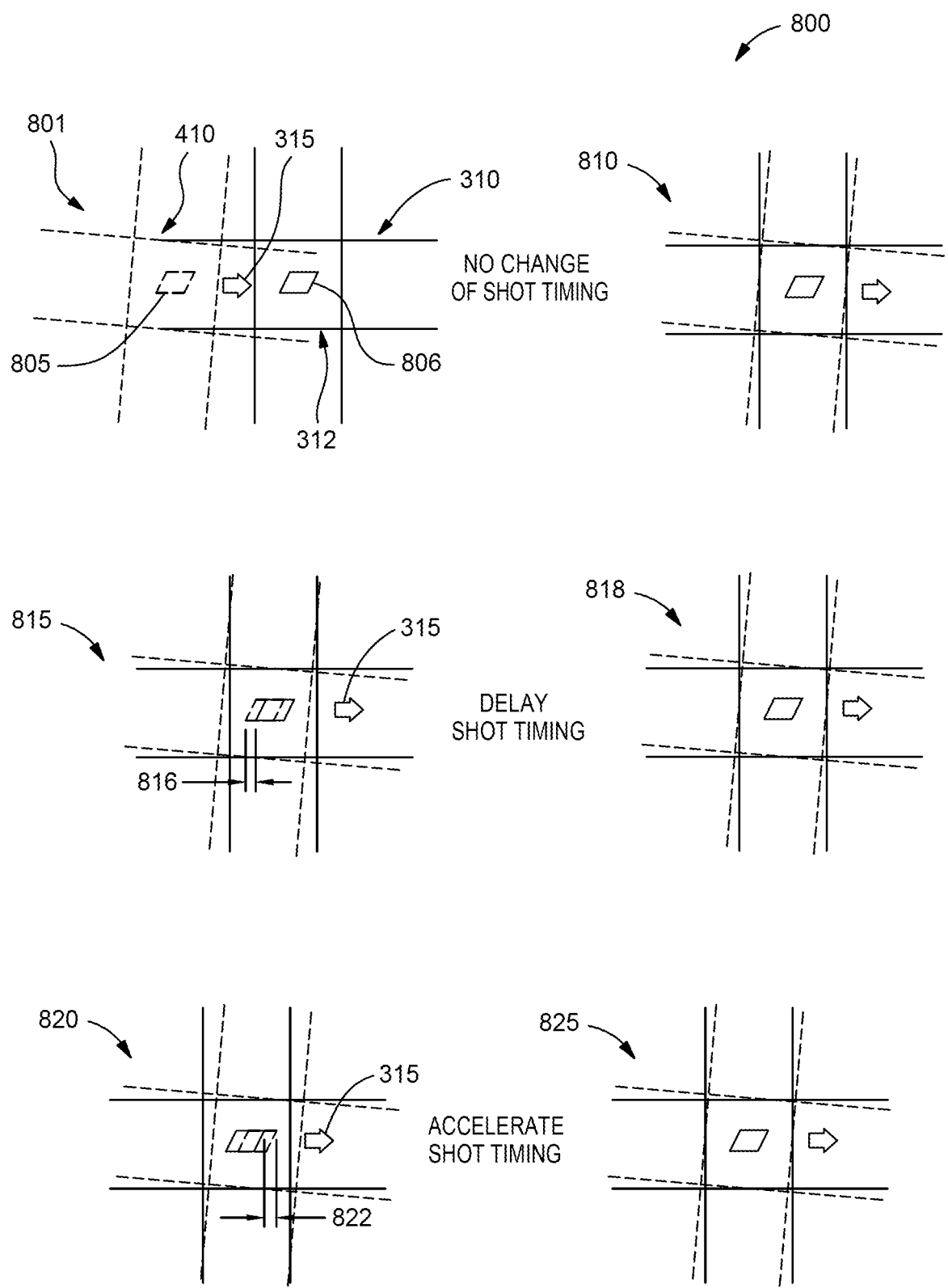
FIG. 8 depicts correction for in-scan direction vibration, according to embodiments.

FIG. 8 depicts correction for in-scan direction vibration 800, according to embodiments.

A first example 801 depicts the SLM 410 approaching the processing position 312 within the track 310 on substrate 140 (not shown in full), traveling in the in-scan direction as shown by arrow 315, with a pre-determined location for a mask pattern 805, which has been rasterized prior to arrival at the processing position 312. The controller 170 waits for the substrate 140 (moving relative to the SLM 410 in the direction opposite to the in-scan direction shown by arrow 315), to reach an overlap position, to place mask pattern 805 at target location 806, at which time controller 170 will cause the light source 402 to flash onto the SLM 410 to transfer the mask pattern 805 at the target location 806 on the substrate 140.

A second example 810 depicts the location that the mask pattern 805 will be printed within the processing region 312 at a desired target location 806. In this example, the controller 170 has received no indication from encoder 126 that there will be vibrational deviation when the SLM 410 is over the processing region 312. In this second example 810, radiation is projected the SLM 410, which prints the mask pattern 805 onto the substrate 140 at the desired location. No modification of the print time delay, or shift in the mask pattern 805 in the SLM 410 is required.

A third example 815 depicts a condition with a negative in-scan vibration determined to be present by the controller when the SLM 410 is over the processing region 312. Because the SLM 410 and mask pattern 805 position is predicted to be at an offset 816 in the negative in-scan direction, the controller causes the printing by SLM 410 to be delayed, resulting in the SLM 410 printing in the desired location, as depicted by 818.

A fourth example 820 depicts a condition predicted by controller 170, in which a positive in-scan vibration is detected by encoder 126, which will result in a positive in-scan offset 822 if no further action is taken. In response, and as shown in 825, the controller 170 accelerates the timing of the shot, causing the SLM 410 to shoot the mask pattern 805 in the desired location within the processing region 312.

Figure 9:
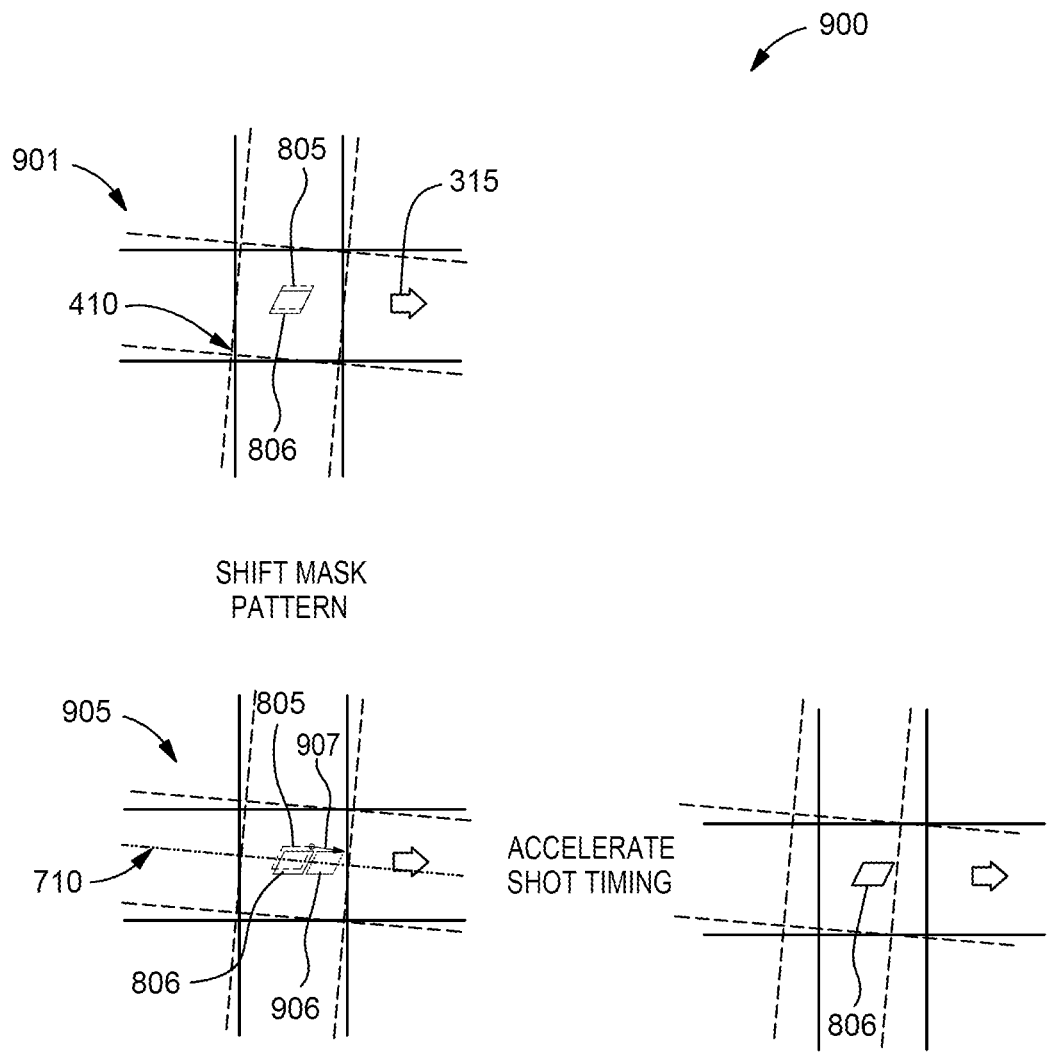
FIG. 9 depicts image stabilization for positive sub-pixel cross-scan vibration, according to disclosed embodiments.

FIG. 9 depicts image stabilization for positive sub-pixel cross-scan vibration 900, according to disclosed embodiments.

A fifth example 901 depicts a condition with a positive cross-scan vibration predictively determined to be present by the controller when the SLM 410 is over the processing region 312, based on data from the encoder 126. As can be seen, if no action is taken, then the mask pattern 805 will be shot out of alignment with the desired target location.

In prior approaches, when the cross-scan vibration was equal (or close to) an SLM pixel size in offset, the mask pattern 805 would be re-rasterized, repositioned, or shifted in the cross-scan direction, on the SLM 410 by SLM pixel increments. In the absence of in-scan vibration, the SLM 410 would be instructed to shoot the shifted mask pattern 805 at the desired target location 806. However, because the mask pattern 805 could only be shifted by full SLM pixel increments, the placement error in the cross-scan direction have to be rounded to the nearest 0.5 pixels which either create an image blur, an overlay error, or a line-edge roughness. As a result, without the benefit of the current disclosure, digital lithography tools will need to optically shrink the pixel pitch to a smaller field size, which reduces the productivity of the tool.

A sixth example 905 depicts correction of sub-pixel deviation in the positive cross-scan direction, according to disclosed embodiments. In this example, as in the fifth example 901, the controller 170 has received data from the encoder 126 indicating a positive cross-scan vibration. The sixth example shows where mask pattern 805 will be shot if no action is taken.

The controller 170 instructs the image projection system 165 to shift the mask pattern 805 on the SLM 410 in the direction of the axis 710 of the SLM. As discussed above, because the SLM 410 is rotated at an angle relative to the in-scan direction 315, shifting, as depicted by arrow 907, the mask pattern 805 along the SLM axis 710 will in turn shift the mask pattern 805 in the cross-scan direction by 1.5-2% for each pixel shifted in the SLM axis 710 direction. As a result, mask pattern 805 shifts to a shifted mask pattern 906 location, correcting for the positive cross-scan vibration. Now, the shifted mask pattern 906 position may be corrected in a manner similar to the fourth example 820 above, by having the controller 170 instruct the image projection system 165 to accelerating the shot timing on the SLM 410, to place the shifted mask pattern 805 at the desired target location 806. In some embodiments, a shot may be timed by setting an in-scan direction coordinate of the substrate, and triggering the shot when the SLM reaches that coordinate. In this context, "adjustment of the timing of the shot," in some embodiments, means changing the in-scan coordinate at which the shot is triggered.

Figure 10:
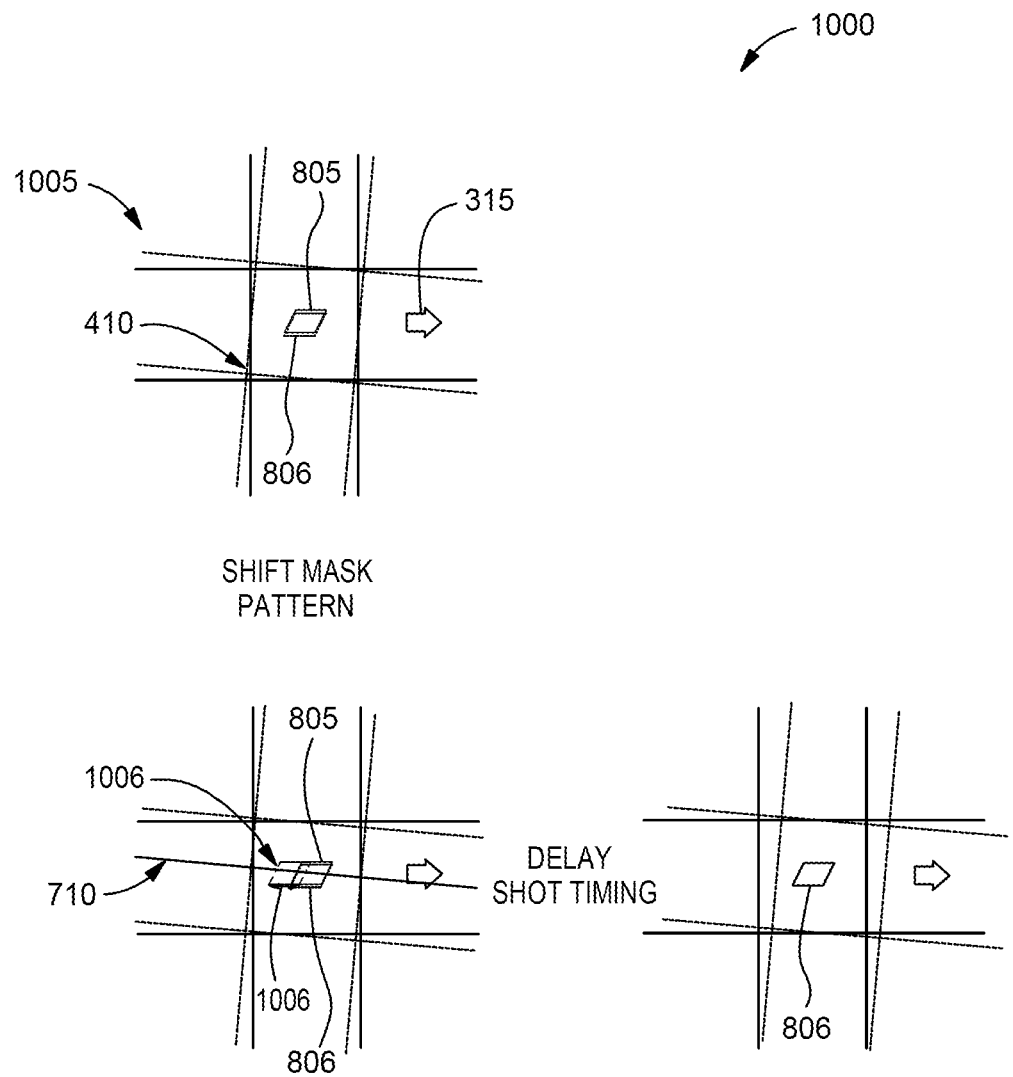
FIG. 10 depicts image stabilization for negative sub-pixel cross-scan vibration, according to disclosed embodiments.

FIG. 10 depicts image stabilization for negative sub-pixel cross-scan vibration, according to disclosed embodiments.

A seventh example 1005 depicts correction of sub-pixel deviation in the negative cross-scan direction, according to disclosed embodiments. In this example, the controller 170 has received data from the encoder 126 indicating a negative cross-scan vibration. The seventh example show where mask pattern 805 will be shot if no action is taken.

The controller 170 instructs the image projection system 165 to shift the mask pattern 805 on the SLM 410 in the negative direction of the axis 710 of the SLM. As discussed above, because the SLM 410 is rotated at an angle relative to the in-scan direction 315, shifting, as depicted by arrow 1003, the mask pattern 805 along the SLM axis 710 will in turn shift the mask pattern 805 in the cross-scan direction by 1.5-2% (in embodiments with an approximate 1 degree rotation of the SLM) for each pixel shifted in the SML axis 710 direction. As a result, mask pattern 805 shifts to a shifted mask pattern 1006 location, correcting for the positive cross-scan vibration. Now, the shifted mask pattern 1006 position may be corrected in a manner similar to the third example 815 above, by having the controller 170 instruct the image projection system 165 to delay the shot timing on the SLM 410, to place the shifted mask pattern 805 at the desired target location 806. In some embodiments, a shot may be timed by setting an in-scan direction coordinate of the substrate, and triggering the shot when the SLM reaches that coordinate. In this context, "adjustment of the timing of the shot," in some embodiments, means changing the in-scan coordinate at which the shot is triggered.

Figure 11:
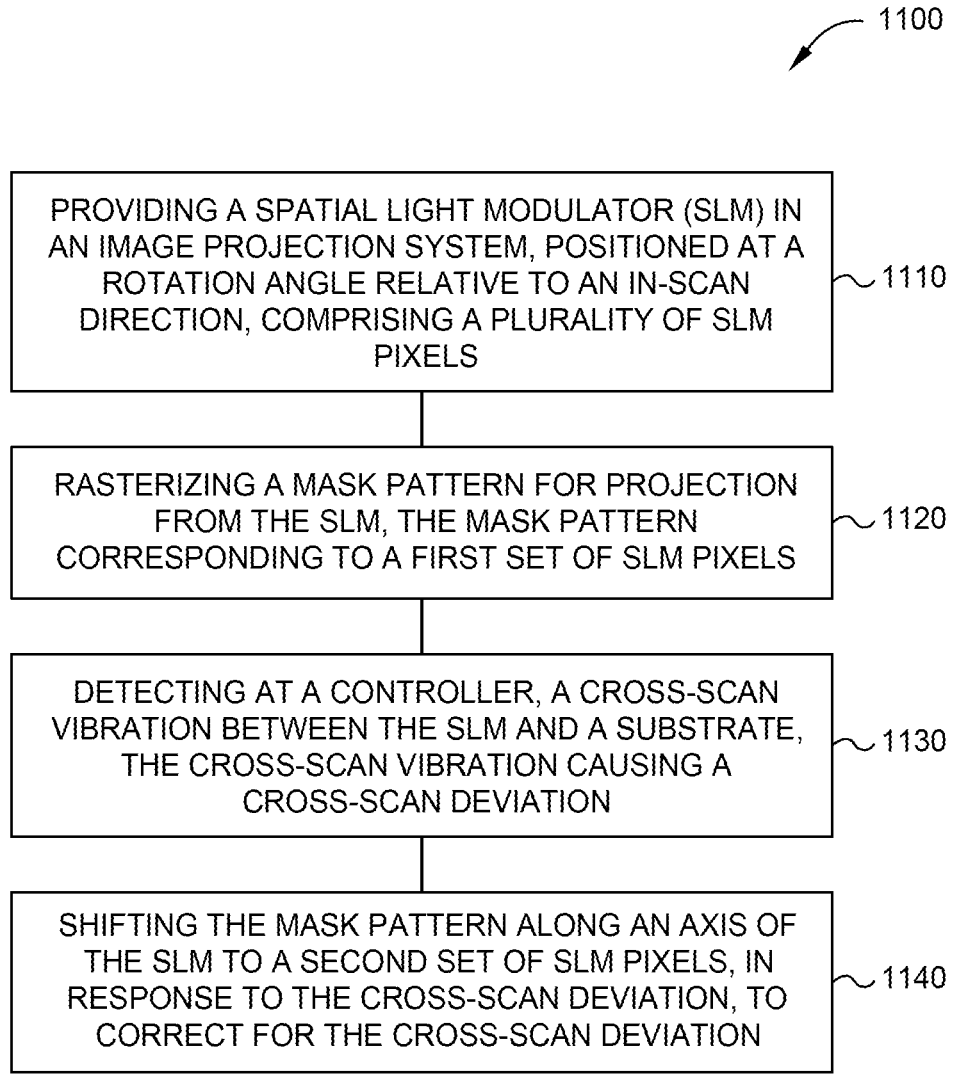
FIG. 11 depicts a method for image stabilization, according to disclosed embodiments.

FIG. 11 depicts a method 1100 for image stabilization, according to disclosed embodiments.

At 1110, the method provides a spatial light modulator (SLM) in an image projection system, positioned at a rotation angle relative to an in-scan direction, comprising a plurality of SLM pixels. In some embodiments, the rotation angle may be from 0.5 degrees to 26 degrees, while in some embodiments, the rotation angle is approximately 1 degrees. For example, $\tan(1°)=0.017$ enables cross scan vibration corrections in increments<$\frac{1}{50}$th of a pixel; similarly 3° enables corrections in increments<$\frac{1}{20}$th of a pixel, 5° enables corrections in increments<$\frac{1}{10}$th of a pixel, 11° enables corrections in increments<$\frac{1}{5}$th of a pixel, 14° enables corrections in increments<$\frac{1}{4}$th of a pixel, 18° enables corrections in increments<$\frac{1}{3}$th of a pixel and 26° enables corrections in increments<$\frac{1}{2}$th of a pixel.

At 1120 the method 1100 further includes rasterizing a mask pattern for projection from the SLM, the mask pattern corresponding to a first set of SLM pixels of the plurality of SLM pixels.

At 1130, the method comprises detecting at a controller, a cross-scan vibration between the SLM and a substrate, the cross-scan vibration causing a cross-scan deviation. In some embodiments, the detected cross-scan vibration is less than one SLM pixel of the plurality of SLM pixels.

At 1140 the method 1100 further includes shifting the mask pattern within the SLM in the in-scan direction, in some embodiments along an axis of the SLM 710 such as an in-scan axis, predominantly parallel to the in-scan direction to a second sent of SLM pixels, in response to the detecting, to correct for the cross-scan deviation, and making a corresponding change to the in-scan exposure location after shifting the mask pattern. In some embodiments, determining the amount of shift of the mask pattern along the axis of the SLM is determined by dividing the cross-scan deviation by the tangent of the rotation angle. In embodiments with nominally 1-degree of SLM rotation, shifting the mask pattern on the SLM by one pixel along the SLM axis corrects for 1.7% pixel of cross-scan deviation.

In embodiments, the method 1100 further comprises providing radiation to the SLM for projecting of the mask pattern onto a substrate, comprising one of delaying and accelerating timing of providing the radiation to the SLM, based on the detecting.

Figure 12:
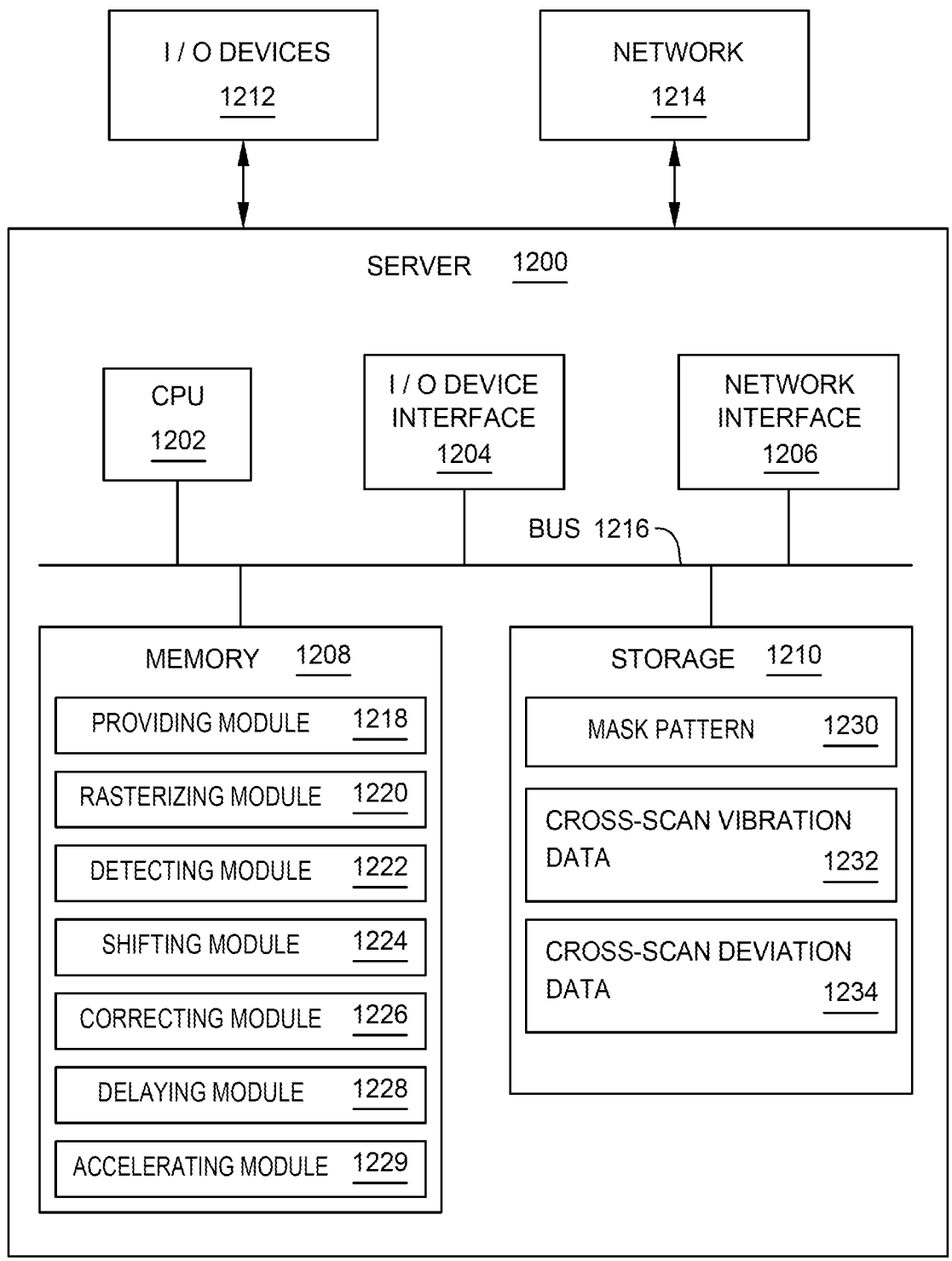
FIG. 12 depicts an example server in an image processing system, according to disclosed embodiments.

FIG. 12 depicts an example server 1200 in an image processing system, that may perform the methods described herein such as the method for image stabilization described with respect to FIGS. 1-11.

Server 1200 includes a central processing unit (CPU) 1202 connected to a data bus 1216. CPU 1202 is configured to process computer-executable instructions, e.g., stored in memory 1208 or storage 1210, and to cause the server 1200 to perform methods described herein, for example with respect to FIGS. 1-11. CPU 1202 is included to be representative of a single CPU, multiple CPUs, a single CPU having multiple processing cores, and other forms of processing architecture capable of executing computer-executable instructions.

Server 1200 further includes input/output (I/O) device(s) 1212 and interfaces 1204, which allows server 1200 to interface with input/output devices 1212, such as, for example, stage position data (e.g., real time and/or instantaneous stage position data) such as in-scan position data (e.g., x coordinate position data) and cross-scan position data (e.g., y coordinate position data) such as from encoder 126, I/O to provide patterns to an SLM such as an SLM 410 in an image projection system 301, and I/O to control the light source such as light source 402, keyboards, displays, mouse devices, pen input, and other devices that allow for interaction with server 1200. Note that server 1200 may connect with external I/O devices through physical and wireless connections (e.g., an external display device).

Server 1200 further includes a network interface 1206, which provides server 1200 with access to external network 1214 and thereby external computing devices.

Server 1200 further includes memory 1208, which in this example includes a providing module 1218, a rasterizing module 1220, a detecting module 1222, a shifting module 1224, a correcting module 1226, a delaying module 1228, and an accelerating module 1229 performing operations described in FIGS. 1-11. Although shown in FIG. 12 as resident in a memory, in some embodiments one or more module may be implemented in software, hardware, or a combination of software and hardware. In some embodiments, such hardware may be programmable hardware such as an FPGA. In some embodiments the rasterizing module 1220 is in (or connected to) one or more graphics processing units (GPUs).

Note that while shown as a single memory 1208 in FIG. 12 for simplicity, the various aspects stored in memory 1208 may be stored in different physical memories, including memories remote from server 1200, but all accessible by CPU 1202 via internal data connections such as bus 1216.

Storage 610 further includes mask pattern data 1230, cross-scan vibration data 1232, and cross-scan deviation data 1234, which may be like that described in FIGS. 1-11. In some embodiments, cross scan vibration data 1232 and cross-scan deviation data 1234 may be provided by one or more sensors, such as encoder 126.

While not depicted in FIG. 12, other aspects may be included in storage 1210.

As with memory 1208, a single storage 1210 is depicted in FIG. 12 for simplicity, but various aspects stored in storage 1210 may be stored in different physical storages, but all accessible to CPU 1202 via internal data connections, such as bus 1216, or external connection, such as network interfaces 1206. One of skill in the art will appreciate that one or more elements of server 1200 may be located remotely and accessed via a network 1214.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented, or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

A processing system may be implemented with a bus architecture. The bus may include any number of interconnecting buses and bridges depending on the specific application of the processing system and the overall design constraints. The bus may link together various circuits including a processor, machine-readable media, and input/output devices, among others. A user interface (e.g., keypad, display, mouse, joystick, etc.) may also be connected to the bus. The bus may also link various other circuits such as timing sources, peripherals, voltage regulators, power management circuits, and other circuit elements that are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media, such as any medium that facilitates the transfer of a computer program from one place to another. The processor may be responsible for managing the bus and general processing, including the execution of software modules stored on the computer-readable storage media. A computer-readable storage medium may be coupled to a processor such that the processor can read information from, and write information to, the storage medium. In the alternative, the storage medium may be integral to the processor. By way of example, the computer-readable media may include a transmission line, a carrier wave modulated by data, and/or a computer readable storage medium with instructions stored thereon separate from the wireless node, all of which may be accessed by the processor through the bus interface. Alternatively, or in addition, the computer-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During the execution of the software module, the processor may load some of the instructions into cache to increase access speed. One or more cache lines may then be loaded into a general register file for execution by the processor. When referring to the functionality of a software module, it will be understood that such functionality is implemented by the processor when executing instructions from that software module.

The following claims are not intended to be limited to the embodiments shown herein, but are to be accorded the full scope consistent with the language of the claims. Within a claim, a reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for image stabilization for digital lithography, comprising:
   providing a spatial light modulator (SLM) in an image projection system, positioned at a rotation angle relative to an in-scan direction, a comprising a plurality of SLM pixels;
   rasterizing a mask pattern to form a rasterized mask pattern for a projection from the SLM, the mask pattern corresponding to a first set of SLM pixels of the plurality of pixels;
   detecting at a controller, a cross-scan vibration between the SLM and a substrate, the cross-scan vibration causing a cross-scan deviation; and
   shifting the rasterized mask pattern within the SLM in the in-scan direction to a second set of SLM pixels by adjusting a timing of the projection of the rasterized mask pattern, in response to the detecting, to correct for the cross-scan deviation.

2. The method of claim 1 further comprising providing radiation to the SLM for projection of the rasterized mask pattern onto a substrate, comprising one of delaying and accelerating timing providing the radiation to the SLM, based on the detecting.

3. The method of claim 1 further comprising determining an amount of shifting of the rasterized mask pattern along the axis of the SLM by dividing the cross-scan deviation by the tangent of the rotation angle.

4. The method of claim 3 wherein the rotation angle is from 0.5 degrees to 26 degrees.

5. The method of claim 4 wherein the rotation angle of the SLM is approximately 1 degree.

6. A system for digital lithography comprising a processor and a memory, the memory comprising computer readable instructions for image stabilization, the method comprising:
   providing a spatial light modulator (SLM) in an image projection system, positioned at a rotation angle relative to an in-scan direction, comprising a plurality of SLM pixels;
   rasterizing a mask pattern to form a rasterized mask pattern for a projection from the SLM, the mask pattern corresponding to a first set of SLM pixels of the plurality of pixels;
   detecting at a controller, a cross-scan vibration between the SLM and a substrate, the cross-scan vibration causing a cross-scan deviation; and
   shifting the rasterized mask pattern within the SLM in the in-scan direction to a second set of SLM pixels by adjusting a timing of the projection of the rasterized mask pattern, in response to the detecting, to correct for the cross-scan deviation.

7. The system of claim 6, the method further comprising providing radiation to the SLM for projection of the rasterized mask pattern onto a substrate, comprising one of delaying and accelerating timing providing the radiation to the SLM, based on the detecting.

8. The system of claim 6, the method further comprising determining an amount of shifting of the rasterized mask pattern along the axis of the SLM by dividing the cross-scan deviation by the tangent of the rotation angle.

9. The system of claim 8 wherein the rotation angle is from 0.5 degrees to 26 degrees.

10. The system of claim 9 wherein the angle of the SLM is approximately 1 degree.

11. A non-transitory computer-readable medium comprising computer readable instructions for a method for image stabilization for digital lithography, the method comprising:
    providing a spatial light modulator (SLM) in an image projection system, positioned at a rotation angle relative to an in-scan direction, comprising a plurality of SLM pixels;
    rasterizing a mask pattern to form a rasterized mask pattern for a projection from the SLM, the mask pattern corresponding to a first set of SLM pixels of the plurality of pixels;
    detecting at a controller, a cross-scan vibration between the SLM and a substrate, the cross-scan vibration causing a cross-scan deviation; and
    shifting the rasterized mask pattern within the SLM in the in-scan direction to a second set of SLM pixels by adjusting a timing of the projection of the rasterized mask pattern, in response to the detecting, to correct for the cross-scan deviation.

12. The non-transitory computer-readable medium of claim 11, the method further comprising providing radiation to the SLM for projection of the rasterized mask pattern onto a substrate, comprising one of delaying and accelerating timing providing the radiation to the SLM, based on the detecting.

13. The non-transitory computer-readable medium of claim 11, the method further comprising determining an amount of shifting of the rasterized mask pattern along the axis of the SLM by dividing the cross-scan deviation by the tangent of the rotation angle.

14. The non-transitory computer-readable medium of claim 13 wherein the rotation angle is from 0.5 degrees to 26 degrees.

15. The non-transitory computer-readable medium of claim 14 wherein the angle of the SLM is approximately 1 degree.

* * * * *